(12) United States Patent
Ueda (10) Patent No.: US 7,728,407 B2
(45) Date of Patent: Jun. 1, 2010

(54) SEMICONDUCTOR DEVICE AND METHOD OF CUTTING ELECTRICAL FUSE

(75) Inventor: Takehiro Ueda, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 346 days.

(21) Appl. No.: 11/749,241

(22) Filed: May 16, 2007

(65) Prior Publication Data

US 2008/0122027 A1 May 29, 2008

(30) Foreign Application Priority Data

Jun. 1, 2006 (JP) ............................. 2006-153510

(51) Int. Cl.
*H01L 29/00* (2006.01)
(52) U.S. Cl. ................... 257/529; 257/209; 257/665; 257/E21.592; 257/E23.129; 257/E23.149; 438/132; 438/467; 438/607; 313/142; 313/251; 365/96; 365/104; 365/177
(58) Field of Classification Search ................ 257/206, 257/665, E23.149, E23.147, 904, 762, 528–543, 257/E21.192; 438/132, 215, 333, 601, 467; 365/225.7, 96, 104, 177, 184
See application file for complete search history.

(56) References Cited

U.S. PATENT DOCUMENTS 4,064,493 A 12/1977 Davis

| 2001/0017755 | A1* | 8/2001 | Toyoshima | ................. | 361/56 |
|---|---|---|---|---|---|
| 2004/0159906 | A1* | 8/2004 | Hashimoto | ................. | 257/529 |
| 2004/0224444 | A1* | 11/2004 | Hisaka | ................. | 438/132 |
| 2004/0262710 | A1* | 12/2004 | Ueda | ................. | 257/529 |
| 2005/0285222 | A1* | 12/2005 | Thei et al. | ................. | 257/529 |
| 2006/0054993 | A1* | 3/2006 | Fukuda | ................. | 257/529 |
| 2007/0007621 | A1* | 1/2007 | Omura et al. | ................. | 257/529 |

FOREIGN PATENT DOCUMENTS

| JP | 2004-214580 | 7/2004 |
|---|---|---|
| JP | 2005-039220 | 2/2005 |
| JP | 2005-057186 | 3/2005 |

* cited by examiner

*Primary Examiner*—Lynne A Gurley
*Assistant Examiner*—Yosef Gebreyesus
(74) *Attorney, Agent, or Firm*—Young & Thompson (57) ABSTRACT

A semiconductor device includes a semiconductor substrate, and an electrical fuse including a first conductor including a first cutting target region, and a second conductor branched from the first conductor and connected to the first conductor and including a second cutting target region, which are formed on the semiconductor substrate, wherein a flowing-out region is formed of the first conductor flowing toward outside between the first cutting target region and the second cutting target region in a condition of cutting the electrical fuse.

19 Claims, 8 Drawing Sheets

SEMICONDUCTOR DEVICE AND METHOD OF CUTTING ELECTRICAL FUSE

This application is based on Japanese Patent application NO. 2006-153510, the content of which is incorporated hereinto by reference.

BACKGROUND

1. Technical Field

The present invention relates to a semiconductor device and a method of cutting an electrical fuse. More specifically, the present invention relates to a semiconductor device including an electrical fuse and a method of cutting an electrical fuse.

2. Related Art

A technology is conventionally known, in which a fuse is mounted in a semiconductor device, and the electric fuse is broken, so that a value of a resistor employed in the semiconductor device is suitably adjusted, or a failure element is separated and replaced into a normal element.

Typical manner for cutting a fuse includes cutting a fuse by irradiating a laser beam in a portion of the fuse and cutting a fuse by applying an electric current.

U.S. Pat. No. 4,064,493 discloses an electric fuse, which is capable of being broken by utilizing a phenomenon, in which a material constituting the electric fuse migrates by an electromigration.

Figure 7:
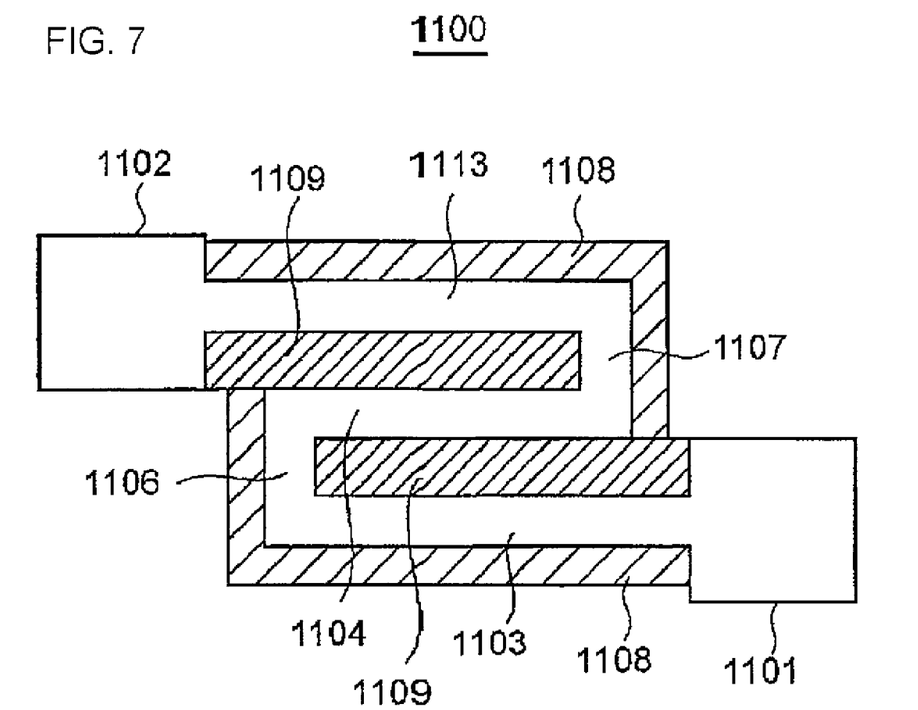
FIG. 7 is a plan view of an example of a conventional electrical fuse.

Japanese Laid-open patent publication No. 2005-39,220 discloses an electric fuse, which is breakable with a smaller current. In Japanese Laid-open patent publication No. 2005-39,220, an electric conductor constituting an electric fuse is formed to have a geometry that the conductor is turned back for several folds. FIG. 7 is a plan view, showing an electric fuse disclosed in Japanese Laid-open patent publication No. 2005-39,220. In this case, a fuse 1100 includes two folds of turn-back.

The fuse 1100 includes a current inflow terminal 1101 and a current drain terminal 1102, and further includes a first forward path straight line 1103, a return path straight line 1104 and a second forward path straight line 1113 between both of the terminals. The fuse 1100 further includes a first perpendicular coupling portion 1106, which provides a coupling between the first forward path straight line 1103 and the return path straight line 1104, and a second perpendicular coupling portion 1107, which provides a coupling between the second forward path straight line 1113 and the return path straight line 1104. When a predetermined current is supplied from current inflow terminal 1101 into current drain terminal 1102 in the fuse 1100 having the above-described configuration, the heats generated in the hatched portions 1108 outside of the fuse 1100 are added to the heats generated in the hatched portions 1109 inside of the fuse 1100, accelerating the breaking of the return path straight line 1104 sandwiched with the hatched portions 1109. This provides easily cutting the fuse 1100.

Moreover, Japanese Laid-open patent publication No. 2005-57,186 has disclosed a configuration in which, when a current is applied to a fuse, heat generated in a portion of the fuse, which is to be cut, is trapped or accumulated in the neighborhood of the portion in the fuse, which is to be cut, by enclosing the portion with a plate.

Figure 8:
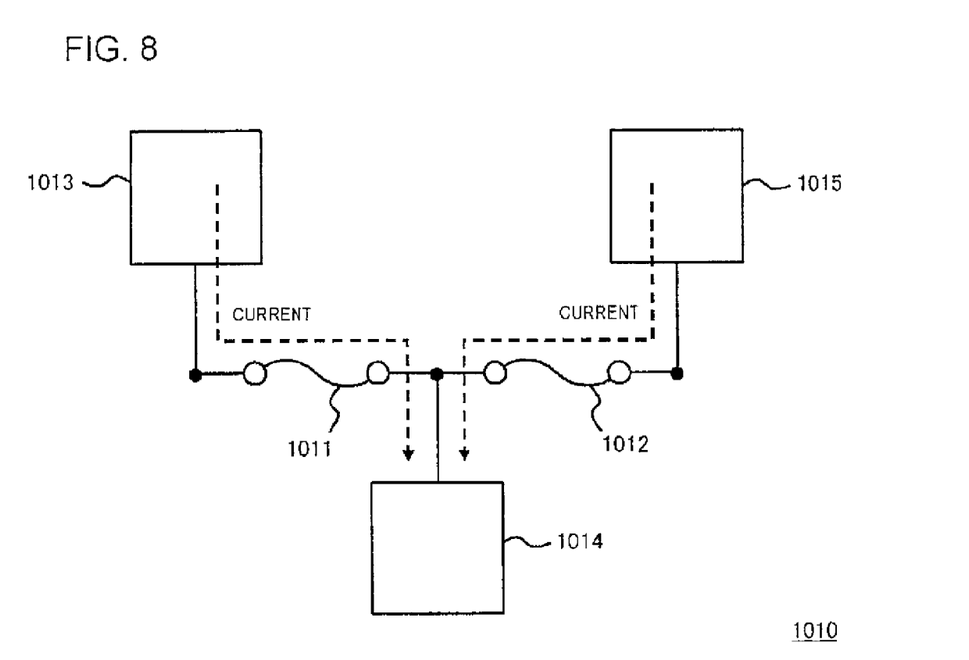
FIG. 8 is a layout view of a conventional fuse layout.

Japanese Laid-Open Patent Publication No. 2004-214,580 discloses a fuse layout for improving yield and reliability by reducing the number of fuse cutting faults. FIG. 8 shows the fuse layout disclosed in the Japanese Laid-Open Patent Publication No. 2004-214,580. On a fuse layout 1010 formed by a interconnect electrode including a barrier metal layer made of a high melting point metal and a main-interconnect metal layer, a plurality of blow fuse portions 1011 and 1012 connected in series are formed. A fuse pad 1013 is formed on one end of the fuse portion 1011, a fuse pad 1014 is formed on a coupling portion coupling the fuse portion 1011 to the fuse portion 1012, and a fuse pad 1015 is formed on the other end of the fuse portion 1012. To flow a current across the fuse portion 1011, a voltage is applied between the fuse pads 1013 and 1014. To flow a current across the fuse portion 1012, a voltage is applied between the fuse pads 1014 and 1015. Based on such like a fuse layout 1010, when at least one of the plurality of fuse portions 1011 and 1012 is cut, the entire fuse layout is cut. It is thereby possible to greatly reduce a cutting fault ratio.

The present inventor has recognized as follows. The techniques disclosed in the U.S. Pat. No. 4,064,493 and the Japanese Laid-Open Patent Publication Nos. 2005-39,220 and 2005-57,186 have the following disadvantages. When the electrical fuse is insufficiently cut or constituent materials of the fuse migrates and the fuse is connected again after the fuse is cut once, it is impossible to accurately decide whether the fuse that should have been cut is cut. The probability of the reconnection or the like of the fuse is not so high, so that it is considered that the fuses provide satisfactory as long as they are used for ordinary operation. However, when requirement for the reliability of the semiconductor device is very strict or such a fuse is used in severe conditions, it is necessary to further improve retention characteristic for keeping cutting condition of the broken electrical fuse.

Moreover, according to the technique disclosed in the Japanese Laid-Open Patent Publication No. 2004-214,580, it is necessary to apply voltages to both ends of the respective fuse portions 1011 and 1012 so as to cut the fuse portions 1011 and 1012. As a result, these may cause a problem that the number of times of cutting processing increases and the configuration of the fuse is complicated.

SUMMARY

According to the present invention, there is provided a semiconductor device including: a semiconductor substrate; and an electrical fuse includes a first conductor including a first cutting target region, and a second conductor branched from and connected to the first conductor including a second cutting target region, which are formed on the semiconductor substrate wherein a flowing-out region is formed of the first conductor flowing toward outside between the first cutting target region and the second cutting target region in a condition after cutting the electrical fuse.

The present inventor has found a novel technique for cutting electric fuses, in which a constitution of an electric fuse or a manner for applying an electric voltage to an electric fuse is suitably controlled, so that a part of an electric conductor that constitutes an electric fuse is forced to be flowed toward outside of the electric fuse leading to losing a balance between a migration and a supply of the electric conductor material, thereby forming a larger cut part in other part when the electric fuse is cut or broken. This allows maintaining an improved condition in cutting or breaking of a cut electric fuse. According to the present invention, the first cutting target region and the second cutting target region are cut or broken using such a cutting mechanism.

According to the present invention, a current is flown across the first conductor to heat and deform the first conductor, whereby the first conductor is caused to flow outside near a coupling portion connecting the first conductor to the second conductor, and the flowing-out region is formed. In this case, the term "outside" may be outside of an area in which the first conductor is formed in the condition before cutting the electrical fuse. For example, when the first conductor is an interconnect, "outside" may be outside of an interconnect trench in which the interconnect is formed. Following this, the first conductor and the second conductor are absorbed in the direction of the flowing-out region. Broken points are generated in the first cutting target region and the second cutting target region, respectively, and the electrical fuse is cut.

The constitution of the present invention allows the two broken point to be formed in one electrical fuse by conducting one processing. It is thereby possible to decide whether the electrical fuse is cut based on cutting condition of the two broken points. Namely, the electrical fuse may be configured so that the first cutting target region is connected to a decision circuit deciding whether the electrical fuse is cut, via the second cutting target region, the decision circuit. It is thereby possible to decide that the electrical fuse is cut when either the first cutting target region or the second cutting target region is cut, and the deciding accuracy can be higher. This allows maintaining an improved condition in cutting or breaking of a cut electric fuse. Here, the second conductor is branched from and connected to the first conductor in a portion different from the first cutting target region.

According to the present invention, there is provided a method for cutting an electrical fuse including a first conductor including a first cutting target region and a second conductor branched from and connected to the first conductor and including a second cutting target region, which are formed on a semiconductor substrate, including:

flowing a current across the first conductor;

causing the first conductor to flow outside near a coupling portion coupling the first conductor to the second conductor; and cutting the first cutting target region and the second cutting target region.

Furthermore, According to the present invention, there is provided a method for manufacturing a semiconductor device, including: selecting a fuse to be cut; and cutting the selected electric fuse by the above-described method for cutting the electric fuse.

According to the present invention, deciding accuracy of the electrical fuse can be higher by a simple method.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Figure 1:
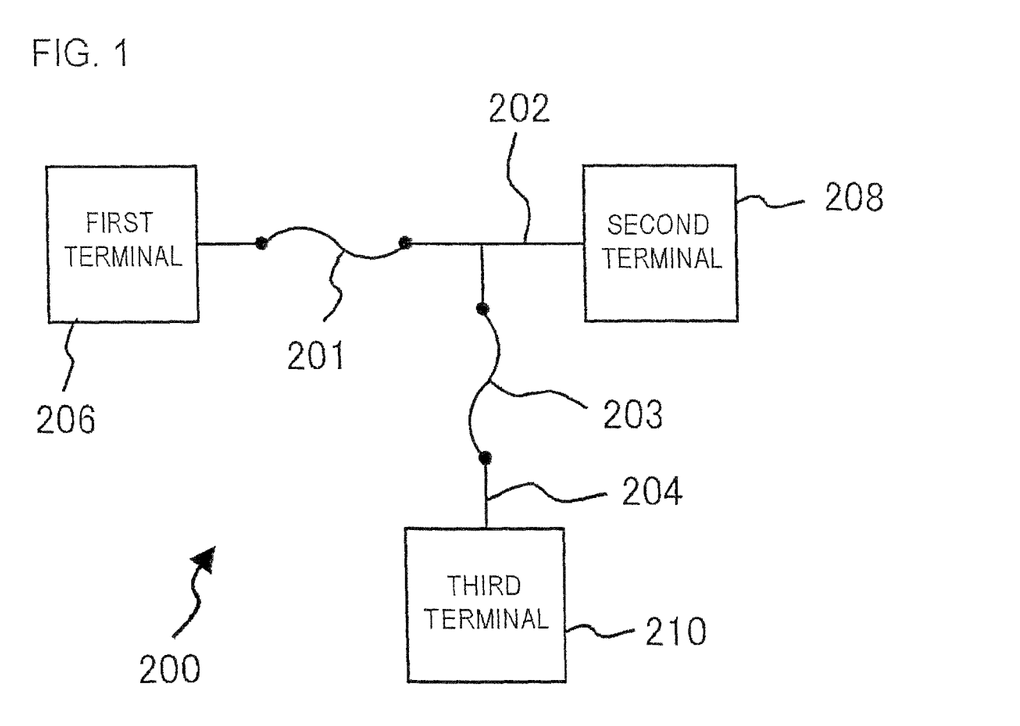
FIG. 1 is a layout view showing a configuration of an electrical fuse according to an embodiment of the present invention.

FIG. 1 is a layout view showing a configuration of an electrical fuse 200 according to an embodiment of the present invention.

The electrical fuse 200 includes a first conductor 202 including a first cutting target region 201, and a second conductor 204 formed to be branched from the first conductor 202 and including a second cutting target region 203. Although not shown in the drawings, the electrical fuse 200 is formed on a semiconductor substrate and formed in insulating films multiple-layered on the semiconductor substrate. In the present embodiment, each of the first conductor 202 and the second conductor 204 that constitute the electrical fuse 200 may be composed of a copper-containing metallic film that contains copper as a major constituent. Further, side surfaces and bottom surfaces or the like of the first conductor 202 and the second conductor 204 can be configured to be coated with barrier metal film.

A first terminal 206 and a second terminal 208 are formed on one end and another end of the first conductor 202, respectively. The first terminal 206 and the second terminal 208 function as a current inflow terminal and a current drain terminal, respectively for cutting the first cutting target region 202 and the second cutting target region 203. One end of the second conductor 204 is connected to the first conductor 202 and a third terminal 210 is formed on another end of the second conductor 204.

The electric fuse 200 having such configuration is cut (or broken) in the following procedure.

First, a high voltage is applied between the first terminal 206 and the second terminal 208, thereby applying excessive power to the first conductor 202. As a result, a current is flown across the first conductor 202, and the first conductor 202 is heated. Subsequently, the heated first conductor 202 expands and flows outside. Specifically, cracks occur to insulating films and the barrier metal film around the expanded first conductor 202 and the first conductor 202 flows into the cracks of the insulating films and the barrier metal film. As a result, flowing-out region is formed in the cracks. In the present embodiment, the electrical fuse 200 is configured so that the first conductor 202 flows outside between the first cutting target region 201 and the second cutting target region 203.

When the first conductor 202 flows outside, then the balance between the migration and the supply of materials is destroyed, and cutting occurs in regions in which the migration of the materials does not follow the supply thereof. Namely, large broken point different from the flowing-out region are formed. The electrical fuse 200 in the present embodiment can be configured so that the first cutting target region 201 and the second cutting target region 203 tend to be easily cut rather than the remaining portions. For example, the first cutting target region 201 can be composed of a narrow interconnect, and the second cutting target region 203 can be composed of a via. A detailed configuration of the electrical fuse 200 will be described below.

According to such configuration, when the first conductor 202 flows outward between the first cutting target region 201 and the second cutting target region 203, the first cutting target region 201 and the second cutting target region 203 are cut. This allows the two broken point to be formed only by applying a predetermined voltage between the first terminal 206 and the second terminal 208. Cutting of the electrical fuse based on this method will be referred to as "crack assist type cutting".

Figure 2A:
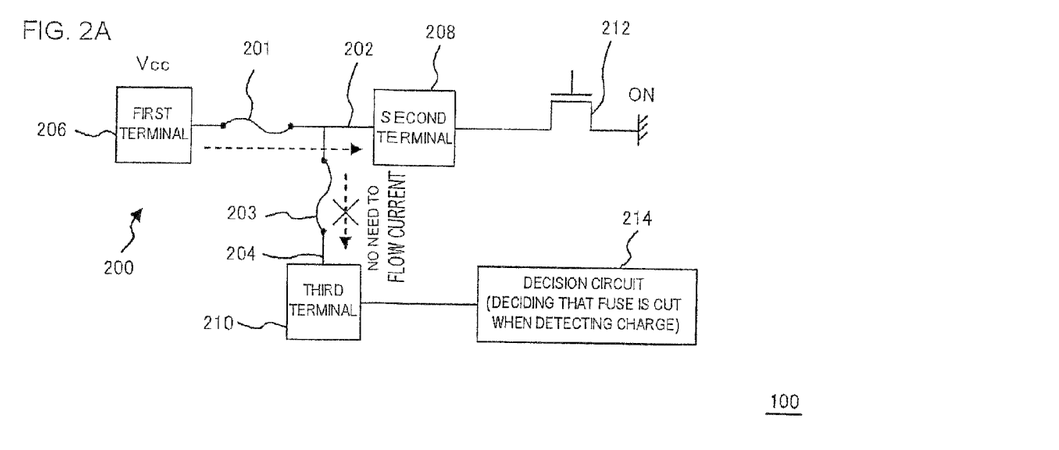
FIGS. 2A and 2B are schematic diagrams showing a configuration of a semiconductor device including the electrical fuse.
Figure 2B:
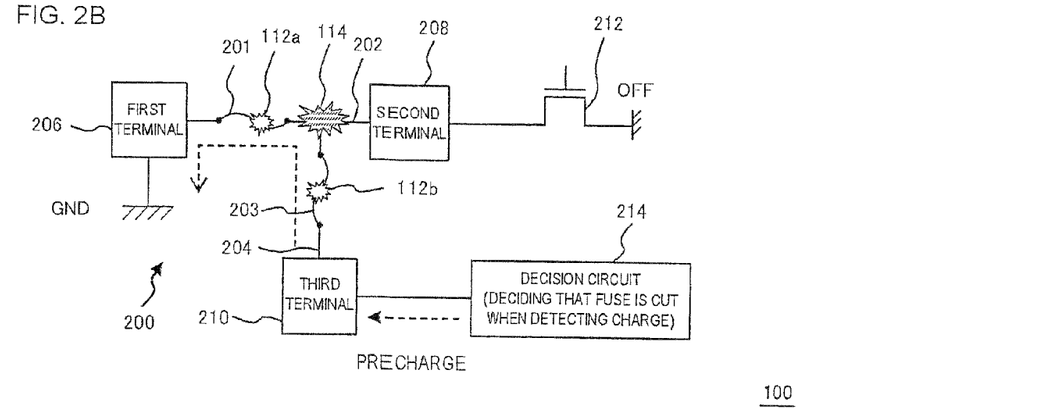

FIGS. 2A and 2B are schematic diagrams showing a configuration of a semiconductor device 100 including the electrical fuse 200. FIG. 2A shows a condition before cutting the electrical fuse 200 and FIG. 2B shows a condition of cutting the electrical fuse 200.

The semiconductor device 100 also includes a transistor 212 and a decision circuit 214. One of a source and a drain of the transistor 212 is grounded and the other is connected to the second terminal 208. The decision circuit 214 is connected to the third terminal 210. The first cutting target region 201 and the second cutting target region 203 are connected in series between the first terminal 206 and the third terminal 210. The first cutting target region 201 is connected to the decision circuit 214 via the second cutting target region 203.

Referring to FIGS. 2A and 2B, a processing for cutting the electrical fuse 200 will be described.

In the present embodiment, when the electrical fuse 200 is to be cut, a predetermined potential $V_{cc}$ is applied to the first terminal 206, and the transistor 212 is turned on, so that the second terminal 208 is grounded. This allows a predetermined voltage to be applied between the first terminal 206 and the second terminal 208, as indicated by a broken line in the drawing, a current to be flown across the first conductor 202. As a result, the first conductor 202 flows outside to form a flowing-out region 114 between the first cutting target region 201 and the second cutting target region 203. In accordance therewith, a first void region 112a and a second void region 112b are formed in the first cutting target region 201 and the second cutting target region 203, respectively, which are cut. In the present embodiment, during a processing for cutting the electrical fuse 200, for example, a voltage of about 2 to 5 volts is applied between the first terminal 206 and the second terminal 208. Therefore, the electrical fuse 200 is formed of the flowing-out region 114, the first void region 112a, and the second void region 112b.

In the present embodiment, during the processing for cutting the electrical fuse 200, the voltage is applied only between the first terminal 206 and the second terminal 208 and no voltage is applied to the third terminal 210. Namely, as shown in FIG. 2A, when the electrical fuse 200 is to be cut, there is no need to flow current across the second conductor 204. In this respect, the present embodiment differs from the conventional fuse layout 1010 shown in FIG. 8. Conventionally, when the fuse portions 1011 and 1012 are to be cut, it is necessary to apply voltages between the fuse pads 1013 and 1014 and between the fuse pads 1015 and 1014, respectively. In the electrical fuse 200 according to the embodiment, the flowing-out region 114 is formed between the first cutting target region 201 and the second cutting target region 203 using the crack assist type cutting method, and the first void region 112a and the second void region 112b can be formed simultaneously. It is thereby possible to form the two broken point in the electrical fuse 200 by the simple method.

Referring to FIG. 2B, a decision processing performed on the electrical fuse 200 will be described.

In the present embodiment, when the decision circuit 214 is to decide whether the electrical fuse 200 is cut, the first terminal 206 is grounded and the decision circuit 214 applies a predetermined potential to the third terminal 210. In this condition, the decision circuit 214 detects whether a potential of the third terminal 210 is high or low. When the potential of the third terminal 210 is high, the decision circuit 214 decides that the electrical fuse 200 is cut. When the potential of the third terminal 210 is low, the decision circuit 214 decides that the electrical fuse 200 is not cut. Specifically, when detecting that the potential of the third terminal 210 is equal to a ground potential, the decision circuit 214 can decide that the potential of the third terminal 210 is low. When detecting that the potential of the third terminal 210 is almost equal to that the potential of the third terminal 210 being applied to, the decision circuit 214 can decide that the potential of the third terminal 210 is high. Alternatively, the decision processing may be performed on the electrical fuse 200 by setting a predetermined reference potential in advance. When a detected potential is lower than the predetermined reference potential, the decision circuit 214 can decide that the potential of the third terminal 210 is low. When the detected potential is higher than the predetermined reference potential, the decision circuit 214 can decide that the potential of the third terminal 210 is high.

When the decision circuit 214 is to decide whether the electrical fuse 200 is cut, this allows the decision circuit 214 to decide that the electrical fuse 200 is cut as long as one of the first cutting target region 201 and the second cutting target region 203 is cut and the deciding accuracy to be higher, maintaining an improved condition in cutting or breaking of a cut electric fuse in addition.

The specific configuration of the electrical fuse 200 according to the embodiment will be described. In the present embodiment, the electrical fuse 200 is composed of a multilayer interconnect structure.

Figure 3:
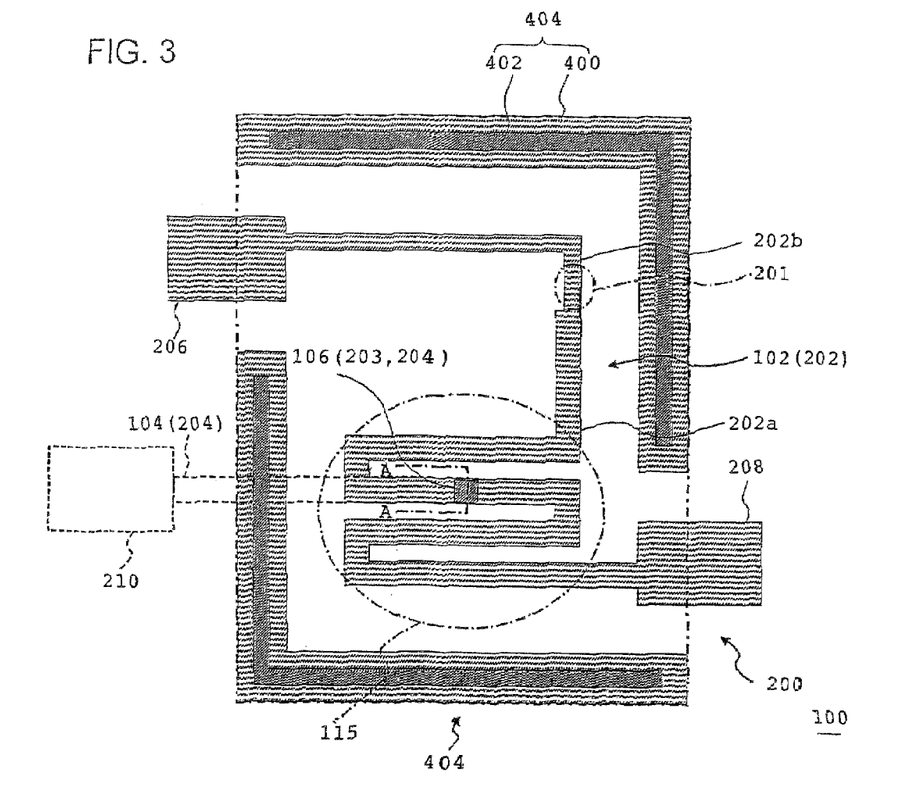
FIG. 3 is a schematic plane top view showing the configuration of the semiconductor device according to the embodiment.
Figure 4:
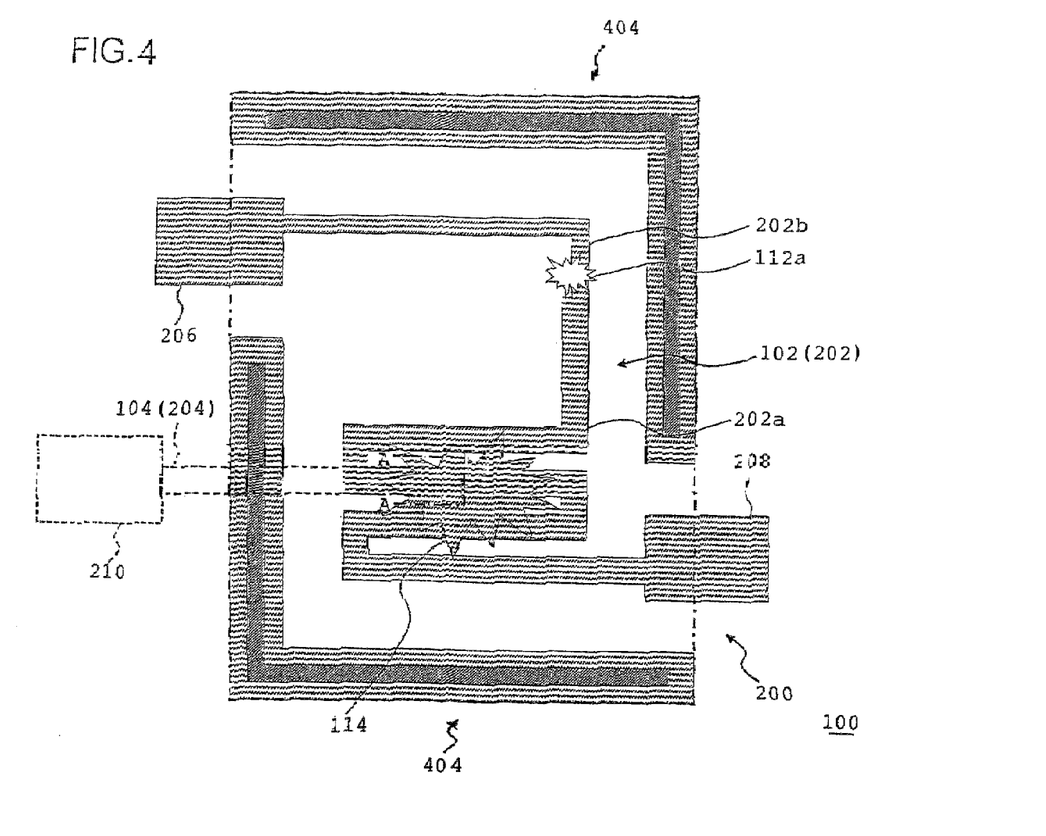
FIG. 4 is a schematic plane top view showing the configuration of the semiconductor device according to the embodiment.

FIGS. 3 and 4 are schematic plane top views showing the configuration of a semiconductor device 100 according to the embodiment. FIG. 3 shows a condition before cutting the electrical fuse 200 and FIG. 4 shows a condition of cutting the electrical fuse 200.

Although not shown in FIGS. 3 and 4, the semiconductor device 100 includes insulating films, and the electrical fuse 200 can be configured to be formed in the insulating films. The electrical fuse 200 includes a first interconnect 102, a via 106 connected to the first interconnect 102, and a second interconnect 104 connected to the via 106, which are formed on different layers, respectively on a semiconductor substrate (not shown). In the present embodiment, an instance in which the first interconnect 102 is formed on an upper layer and in which the second interconnect 104 is formed on a lower layer will be described. On the contrary, the first interconnect 102 may be formed on the lower layer and the second interconnect 104 may be formed on the upper layer.

The first interconnect 102 is composed of the first conductor 202. The first interconnect 102 includes a narrow interconnect 202b and a wide interconnect 202a being connected to the narrow interconnect 202b and formed to be wider than the narrow interconnect 202b.

In the present embodiment, the first terminal 206 and the second terminal 208 are composed of pad electrodes formed on the same layer on which the first interconnect 102 is formed. The narrow interconnect 202b is connected to the first terminal 206 and the wide interconnect 202a is connected to the second terminal 208. The first terminal 206 and the second terminal 208 can be formed to be wider than the first interconnect 102. For example, a width of the narrow interconnect 202b is 0.1 micrometer, that of the wide interconnect 202a is 0.15 micrometer, and those of the first terminal 206 and the second terminal 208 are 0.4 micrometer.

In the present embodiment, the wide interconnect 202a includes a folded area in which a plurality of straight lines are arranged in parallel by turning back. With the configuration shown in FIGS. 3 and 4, the wide interconnect 202a includes a first straight line connected to the second terminal 208, a second straight line arranged almost in parallel to the first straight line, a third straight line arranged almost in parallel to the second straight line, a fourth straight line arranged almost in parallel to the third straight line, a first coupling portion connecting the first straight line to the second straight line, a second coupling portion connecting the second straight line to the third straight line, a third coupling portion connecting the third straight line to the fourth straight line, and a fourth coupling portion connecting the fourth straight line to the narrow interconnect 202b. The folded area includes the first straight line, the second straight line, the third straight line, the fourth straight line, the first connecting portion, the second connecting portion, and the third coupling portion.

According to suchlike configuration, when a current is flowed in the first interconnect 102 (first conductor 202) during the processing for cutting the electrical fuse 200, the first conductor 202 to be easily heated in the folded area. This allows the flowing-out region 114 to be easily formed in the folded area. In other words, an expected flowing-out area 115, in which the flowing-out region 114 is formed when the electrical fuse 200 is cut, is formed in the folded area of the wide interconnect 202a.

When the flowing-out region 114 is formed in the folded area of the wide interconnect 202a, the first conductor 202 migrates in a direction of the flowing-out region 114 and the narrow interconnect 202b having the narrow width to easily be cut. This allows the first void region 112a to be easily formed near a coupling portion connecting the narrow interconnect 202b to the wide interconnect 202a. That is, the first cutting target region 201 is formed near the coupling portion connecting the narrow interconnect 202b to the wide interconnect 202a.

The narrow interconnect 202b is connected to the wide interconnect 202a outside of the folded area. It is thereby possible to provide the expected flowing-out area 115 to be apart from the cutting target region 201. When the electrical fuse 200 is cut, this allows the flowing-out region 114 to be separated from the first void region 112a. When the flowing-out region 114 is located near the first void region 112a, the flowing-out region 114 is possibly formed into a bridge between portions of the first conductor 202 which portions should be electrically cut. When such a bridge is formed, the electrical fuse 200 that has been cut is connected by the flowing-out region 114, leading to reducing cutting yield (reduction in resistance after cutting), a change in resistance after cutting (temporal resistance change), and the like. In the present embodiment, a length of the fourth coupling portion connecting the fourth straight line to the narrow interconnect 202b is adjusted, which allow the first cutting target region 201 to be provided away from the expected flowing-out area 115. It is thereby possible to prevent formation of the bridge and to maintain an improved condition in cutting or breaking of the first cutting region 201.

The via 106 and the second interconnect 104 are composed of the second conductor 204. In the present embodiment, the third terminal 210 is composed of a pad electrode formed in the same layer in which the second interconnect 104 is formed. The third terminal 210 can be formed wider than the second interconnect 104. For example, a width of the second interconnect 104 is 0.15 micrometer and that of the third terminal 210 is 0.4 micrometer.

The via 106 is connected to the wide interconnect 202a of the first interconnect 102. More specifically, the via 106 is connected to the wide interconnect 202a in the folded area. When current is applied to the first interconnect 102 during the processing for cutting the electrical fuse 200, this allows the first conductor 202 to flow outside near a coupling portion connecting the first interconnect 102 to the via 106, thus the flowing-out region 114 to be easily formed. Therefore, when the flowing-out region 114 is formed in the first interconnect 102, the second conductor 204 constituting the via 106 is absorbed in the direction of the flowing-out region 114, which allows the second void region 112b (not shown in FIG. 4) to be easily formed in the via 106. In other words, the second cutting region 203 is formed in the via 106.

Moreover, the via 106 is connected to the wide interconnect 202a in the folded area of the first interconnect 102, which allows the second conductor 204 constituting the via 106 to be also heated, and the second conductor 204 to be blasted out from the via 106.

In the present embodiment, the second void region 112b and the flowing-out region 114 are formed on the different layers, which prevent formation of a bridge on the second void region 112b as described above.

Furthermore, the semiconductor device 100 includes the electrical fuse 200 composed of a top, a bottom, and a side surface which are covered with a cover member 404. The cover member 404 is composed of a via 402, an electrode 400, and a plate (not shown). The electrode 400 can be formed as a pad electrode formed on the same layers on which the first interconnect 102 and the second interconnect 104 are formed, respectively. The via 402 is formed in each of an upper layer and a lower layer of the electrode 400, and connects the plate (not shown) to the electrode 400 on which formed each of the upper and lower layers. The via 402 can be provided as a slit via, so that the electrical fuse 200 is surrounded by the via 402 and the electrode 400 in the form of a wall. When a current is flowed between the first terminal 206 and the second terminal 208, this allows the heat generated in the first conductor 202 to be reflected by the cover member 404 and to be confined within the cover member 404, and the flowing-out region 114 to be easily formed in the electrical fuse 200. Further, the cover member 404 can block constituent materials of the electrical fuse 200 from scattering around the electrical fuse 200 when the flowing-out region 114 is formed. It is thereby possible to prevent scattering pieces of the constituent materials of the electrical fuse 200 from reaching the other elements.

The first interconnect 102 is not limited to that shown in the drawings but can be formed in various shapes. In any case, the first interconnect 102 is formed to include the region which to be easily heated and in which the flowing-out region 114 to be easily formed when the current is flown across the first interconnect 102, and the region which tends to be cut when the flowing-out region 114 is formed. The via 106 is connected to the most likely heated portion of the first interconnect 102.

According to configuration as described above, the first conductor 202 flows out in the heated point of the first interconnect 102, so that the flowing-out region 114 is formed. In accordance therewith, the first conductor 202 migrates in the direction of the flowing-out region 114, and the narrow interconnect 202b as a point to be easily cut in the first interconnect 102 is cut. Furthermore, the second conductor 204 constituting the via 106 is absorbed in the direction of the flowing-out region 114, and the via 106 is also cut. As a consequence, the electrical fuse 200 is provided two broken point being formed almost simultaneously.

Figure 5A:
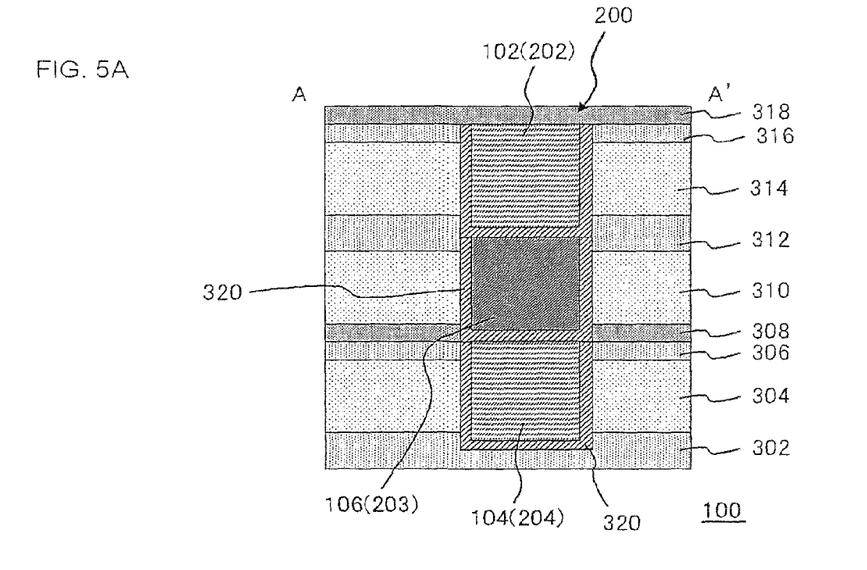
FIGS. 5A and 5B are an example of cross-sectional views along lines A-A of FIGS. 3 and 4, respectively.
Figure 5B:
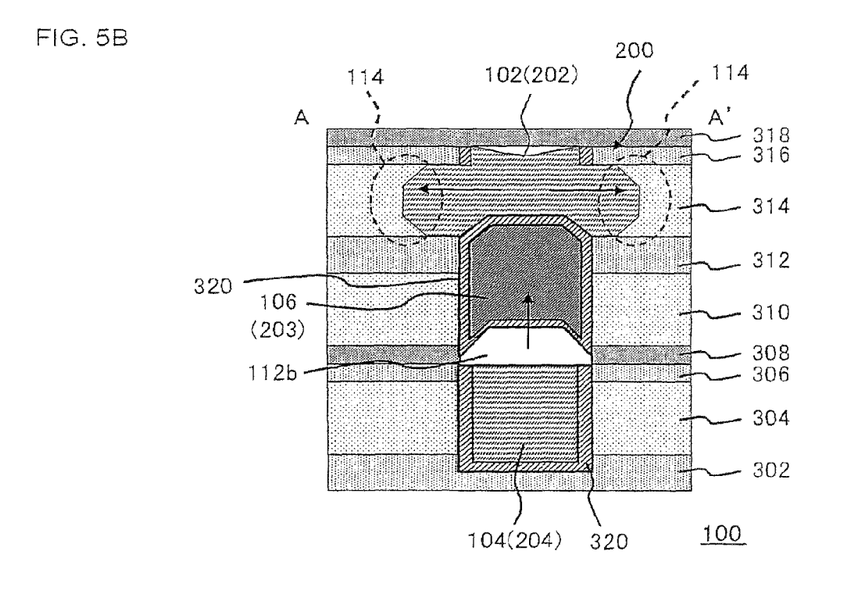

FIGS. 5A and 5B are an example of cross-sectional views along lines A-A' of FIGS. 3 and 4, respectively.

FIG. 5A is a cross-sectional view along the line A-A' of FIG. 3 and FIG. 5B is a cross-sectional view along the line A-A' of FIG. 4. Here, an interconnect structure of a single damascene structure is shown in FIGS. 5A and 5B.

As shown in FIG. 5A, the semiconductor device 100 includes a semiconductor substrate (not shown). The semiconductor device 100 also includes a first etch stop film 302, a first interlayer insulating film 304, a first protective film 306, a second etch stop film 308, a second interlayer insulating film 310, a third etch stop film 312, a third interlayer insulating film 314, a second protective film 316, and a fourth etch stop film 318 formed on the semiconductor substrate in this order.

In a condition before cutting the electrical fuse 200, the via 106 is formed to be electrically connected to the first interconnect 102 and the second interconnect 104. Here, the second interconnect 104 is formed in the first etch stop film 302, the first interlayer insulating film 304, and the first protective film 306. The via 106 is formed in the second etch stop film 308, the second interlayer insulating film 310, and the third etch stop film 312. The first interconnect 102 is formed in the third etch stop film 312, the third interlayer insulating film 314, and the second protective film 316.

The second interconnect 104, the via 106, and the first interconnect 102 can be composed of a copper-containing metallic film containing copper as a major constituent. The copper-containing metallic film may contain silver. The copper-containing metallic film may have a composition additionally containing one or more different element(s) selected from a group consisting of aluminum (Al), gold (Au), platinum (Pt), chromium (Cr), molybdenum (Me), tungsten (W), magnesium (Mg), beryllium (Be), zirconium (Zn), palladium (Pd), cadmium (Cd), mercury (Hg), silicon (Si), zirconium (Zr), titanium (Ti) and tin (Sn). The copper-containing metallic film may be formed via a plating process, for example. Further, the surface of the copper-containing metallic film may be configured of, for example, provided with a silicide film formed thereon.

Further, the side surface and the bottom surface of the second interconnect 104, the via 106 and the first interconnect 102 are provided with a barrier metal film 320 respectively, which are provided so as to contact with and cover these interconnects and via. The barrier metal film 320 may be configured to include a refractory metal. The barrier metal film 320 may be composed of, for example, tantalum (Ta), tantalum nitride (TaN), Ti, titanium nitride (TiN), W, tungsten nitride (WN) or the like.

More specifically, in the condition before cutting the electrical fuse 200, the barrier metal film 320 is provided between the second interconnect 104 and the via 106. Likewise, the barrier metal film 320 is provided between the via 106 and the first interconnect 102.

The first interlayer insulating film 304 and the third interlayer insulating film 314 be composed of a low dielectric constant film such as silicon oxycarbide (SiOC) and the like. Typical low dielectric constant film includes, in addition to SiOC, poly hydrogen siloxane such as hydrogen silsesquioxane (HSQ), methyl silsesquioxane (MSQ), methylated hydrogen silsesquioxane (MHSQ) and the like, aromatic compound-containing organic materials such as poly aryl ether (PAE), divinyl siloxane-bis-benzocyclobutene (BCB), SILK™ (commercially available from Hitachi Chemical Co., Ltd., Tokyo Japan) and the like, silicon oxide glass (SOG), a flowable-oxide (FOX), CYTOP™ (commercially available from Asahi Glass Co., Ltd., Tokyo Japan), or benzocyclobutene (BCB). Alternatively, a porous film of the above-described material may also be employed for the low dielectric constant film. The first interlayer insulating film 304 and the third interlayer insulating film 314 may be composed of the same material, or may be composed of different materials.

In addition, the second interlayer insulating film 310 can be composed of the material similar as that described above concerning the first interlayer insulating film 304 and the third interlayer insulating film 314. However, in relation to the first interlayer insulating film 304 and the third interlayer insulating film 314, the second interlayer insulating film 310 may preferably be composed of a harder material than the first interlayer insulating film 304 and the third interlayer insulating film 314. For example, the second interlayer insulating film 310 may be composed of a material having higher Young's modulus than that of the first interlayer insulating film 304 and the third interlayer insulating film 314. Such configuration allows easily forming the flowing-out region 114 in the first interconnect 102 and easily forming the second void region 112b in the via 106.

For example, the second interlayer insulating film 310, in which the via 106 is formed, is composed of SiOC (Black Diamond, commercially available from Applied Materials Inc., Santa Clara, Calif., USA) and the third interlayer insulating film, in which the first interconnect 102 is formed, is composed of SiOC (Aurora, commercially available from ASM International N.V., Holland). Both of the Black Diamond and the Aurora are porous films of SiOC, and the Aurora has lower specific dielectric constant, lower film density and composed of softer film than the Black Diamond.

In addition to above, the configuration of the second interlayer insulating film 310 is not limited to such configuration, and may also be composed of a material similar to that of the first interlayer insulating film 304 and the third interlayer insulating film 314. In this case, the first interconnect 102 generates self-heating with a current supplied and has a larger expansion amount whereas the via 106 has a small conductor volume and a small expansion amount which allows the flowing-out region 114 in the first interconnect 102 and the second void region 112b in the via 106 to be selectively form.

The second etch stop film 308 and the fourth etch stop film 318 utilized in forming the via hole and the interconnect trench, and also function as preventing a diffusion of copper constituting the second interconnect 104 and the first interconnect 102. In addition, these also function as coating films for the electric fuse 200 in the present embodiment. The second etch stop film 308 and the fourth etch stop film 318 may be composed of a harder material than the first interlayer insulating film 304 and the third interlayer insulating film 314. The second etch stop film 308 and the fourth etch stop film 318 may be composed of a material having higher Young's modulus than that of the first interlayer insulating film 304 and the third interlayer insulating film 314. The second etch stop film 308 and the fourth etch stop film 318 may be composed of for example, silicon carbonitride (SiCN), silicon nitride (SiN), silicon carbide (SiC), silicon oxyfluoride (SiOF) or silicon oxynitride (SiON).

The first protective film 306 and the second protective film 316 function as protecting the first interlayer insulating film 304 and the third interlayer insulating film 314 respectively when the second interconnect 104 and the first interconnect 102 are polished via a chemical mechanical polishing (CMP) process. The first protective film 306 and the second protective film 316 may be composed of, for example, silicon dioxide ($SiO_2$) films.

The first etch stop film 302 and the third etch stop film 312 may be composed of the material similar as that of the second etch stop film 308 and the fourth etch stop film 318. In addition, although it is not shown here, each of the first etch stop film 302 and the third etch stop film 312 may also composed of a multiple-layered film including a first insulating film composed of the material similar as that of the second etch stop film 308 and the fourth etch stop film 318 and a second insulating film formed thereon and composed of the material similar as that of the first protective film 306 and the second protective film 316.

In addition to above, the second interconnect 104, the via 106, the first interconnect 102 or the like having the above-described configurations may be formed by the process operation, which is similar to that for forming the ordinary multiple-layered interconnect structure. This allows forming the electric fuse 200 without a need for adding a special operation.

As described above, for example, it may be configured that a periphery of the first interconnect 102 is covered with a coating film such as the barrier metal film 320 and the fourth etch stop film 318, and further the third interlayer insulating film 314 composed of a material that is softer than the coating film is formed in the periphery thereof Next, a procedure for cutting the electric fuse 200 having such configuration will be described.

When a predetermined voltage is applied across the first terminal 206 and the second terminal 208 to apply an excessive power to the first interconnect 102, the first conductor 202 constituting the first interconnect 102 is heated and expanded, so that it expands toward a direction to the third interlayer insulating film 314, which is composed of a soft film. At this time, the first conductor 202 is heated and expanded most strongly in the expected flowing-out area 115 including the folded area of the wide interconnect 202a of the first interconnect 102. Due to this, as expansion of the first conductor 202 progresses, in the expected flowing-out area 115, cracks are generated in the barrier metal film 320 and the like formed around the first interconnect 102 and the first conductor 202 flows into the third interlayer insulating film 314 through the cracks. Namely, the first conductor 202 constituting the first interconnect 102 flows outside of the interconnect trench. As a result, this achieves forming the flowing-out region 114, as shown in FIGS. 4 and 5B.

Further, since the first conductor 202 rapidly migrates toward the flowing-out region 114, the first conductor 202 is cut at the spot where the migration of the conductor can not keep up with other portions. In the present embodiment, the conductor is cut in the first cutting target region 201 and the via 106, and the first void region 112a and the second void region 112b are formed in the broken point, respectively. Such a mechanism enables the flowing-out region 114, the first void region 112a, and the second void region 112b to be formed to be apart from one another.

In addition, since the barrier metal film 320 is provided between the via 106 and the second interconnect 104 in the present embodiment, the barrier metal film 320 is easily peeled off from the second interconnect 104, such that the second void region 112b is easily formed between the barrier metal film 320 and the second interconnect 104.

Moreover, in a condition of cutting the electrical fuse 200, the second conductor 204 constituting the via 106 migrates together with the barrier metal film 320, thereby forming the second void region 112b between the barrier metal film 320 and the second interconnect 104. Therefore, even if a thermal processing is conducted after such process, the barrier metal film 320 can prevent the copper-based metal film from migrating again, and re-connection with the via 106 and the second interconnect 104. This allows providing an improved thermal resistance of the semiconductor device 100. Since barrier metal films 320 are provided to forma double-layered structure between the flowing-out region 114 and the second void region 112b, migration of the copper-based metal film can be further prevented.

The above embodiment illustrates the exemplary implementation, in which a crack is created in the barrier metal film 320 and the like. However, it sometimes happens than when the first interconnect 102 is heated and expanded, then the fourth etch stop film 318 is peeled off from the first interconnect 102 or the second protective film 316 thereby creating a gap between these films. In this case, the first conductor 202 flows into the gap to form the flowing-out region 114. Even in such case, the first conductor 202 migrates toward the flowing-out region 114, so that second cavities 112b is formed in the first cutting target region 201 and the via 106.

Figure 6A:
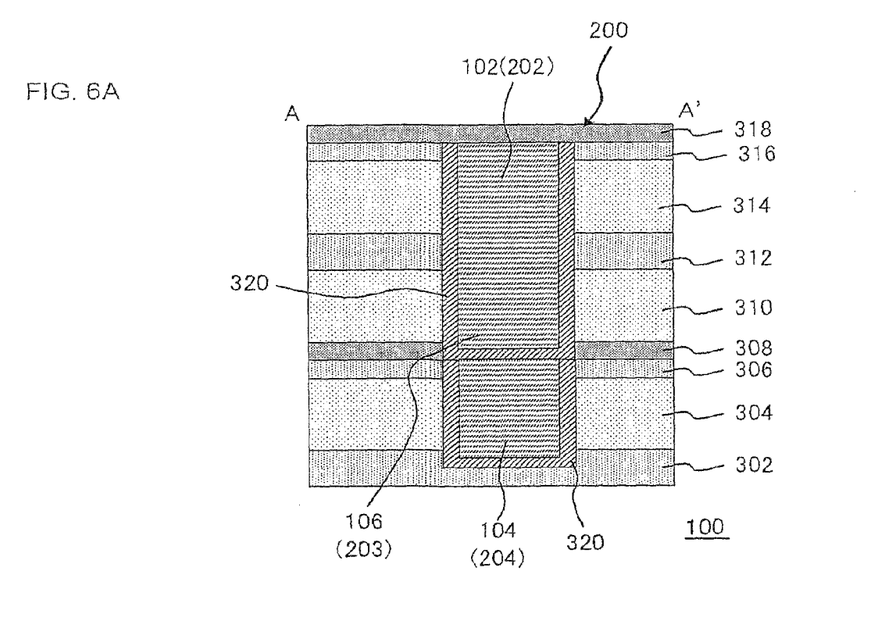
FIGS. 6A and 6B are another example of cross-sectional views along the lines A-A of FIGS. 3 and 4, respectively.
Figure 6B:
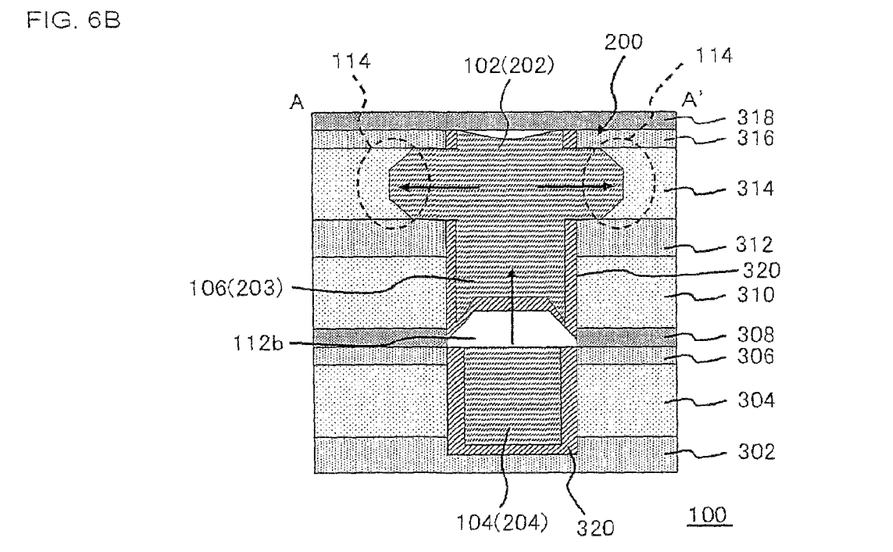

FIGS. 6A and 6B are another example of cross-sectional views along the lines A-A of FIGS. 3 and 4, respectively.

FIG. 6A is a cross-sectional view along the line A-A' of FIG. 3. FIG. 6B is a cross-sectional view along the line A-A' of FIG. 4.

In this case, the configuration is different from the exemplary implementation shown in FIGS. 5A and 5B in terms of the interconnect structure having a dual damascene structure. Further, the via 106 and the first interconnect 102 are integrally formed to constitute a dual damascene interconnect. The via 106 is formed in the second etch stop film 308, the second interlayer insulating film 310, and the third etch stop film 312. The first interconnect 102 is formed in the third etch stop film 312, the third interlayer insulating film 314, and the second protective film 316.

The dual damascene interconnect composed of the via 106 and the first interconnect 102 is configured that the side surfaces and the bottom surface thereof are covered with the barrier metal film 320. In the condition before cutting the electrical fuse 200, the barrier metal film 320 is provided between the via 106 and the second interconnect 104 so as to be in contact therewith.

In the electrical fuse 200 configured as condition above, when excessive power is applied to the first interconnect 102, then the first conductor 202 constituting the first interconnect 102, so that it expands toward a direction to the third interlayer insulating film 314, which is composed of a soft film. Following expansion of the first conductor 202, cracks are generated in the barrier metal film 320, so that the first conductor 202 flows into the third interlayer insulating film 314. This achieves forming the flowing-out region 114, as shown in FIG. 6B. The first interconnect 102 is cut at the spot where the migration of the first conductor 202 a1can not keep up with other portions. In the present embodiment, the first conductor 202 is cut in the first cutting target region 201 of the narrow interconnect 202b, thereby forming the first void region 112a.

Furthermore, since the second conductor 204 also rapidly migrates toward the flowing-out region 114, the second conductor 204 is cut at the spot where the migration of the second conductor 204 can not keep up with other portions. In the present embodiment, the second conductor 204 is cut in the via 106, thereby forming the second void region 112b in the via 106. Furthermore, in the present embodiment, since the barrier metal film 320 is provided between the via 106 and the second interconnect 104, the barrier metal film 320 is easily peeled off from the second interconnect 104 and the second void region 112b is easily formed between the barrier metal film 320 and the second interconnect 104.

Further, in the condition of cutting the electrical fuse 200, the second conductor 204 constituting the via 106 migrates together with the barrier metal film 320, thereby forming the second void region 112b between the barrier metal film 320 and the second interconnect 104. Therefore, even if a thermal processing is conducted after such process, the barrier metal film 320 can prevent a re-connection with the via 106 and the second interconnect 104, which is otherwise caused by a re-migration of the electric conductor composed of a copper-containing metallic film. This allows providing an improved thermal resistance of the semiconductor device 100.

According to the semiconductor device 100 including the electrical fuse 200 in the present embodiment as described above, the two broken point can be formed by conducting one processing. It is thereby possible to decide whether the electrical fuse 200 is cut based on cut condition of the two broken point. It is thereby possible to decide that the electrical fuse 200 is cut when either the first cutting target region 201 or the second cutting target region 203 is cut. This allows deciding accuracy of the electrical fuse can be higher. It is also possible to maintain an improved condition in cutting or breaking of the cut electrical fuse 200. Moreover, since the via 203 is cut in the second cutting target region 203, a possibility of reconnecting the electrical fuse 200 may be reduced and the electrical fuse 200 may be kept in a better cut condition.

Since the electric fuse 200 is composed of the multiple-layered interconnect structure according to the semiconductor device 100 in the present embodiment as described above, these can be arranged in the layered direction, thereby achieving a reduced area for forming the electric fuse.

The embodiments of the present invention have been described so far with reference to the drawings. However, the embodiments are given only for illustrative purposes and various other configurations can be applied to the present invention.

It is apparent that the present invention is not limited to the above embodiment, that may be modified and changed without departing from the scope and spirit of the invention.

What is claimed is:

1. A semiconductor device comprising:
   a semiconductor substrate; and
   an electrical fuse formed on the semiconductor substrate, the electrical fuse including:
   a first conductor extending along a first conductor path including a first cutting target region; and
   a second conductor extending along a second conductor path branched from said first conductor and connected to said first conductor and including a second cutting target region,
   wherein a material of said first conductor is configured, upon a condition of cutting the electrical fuse, to flow toward a region outside the first conductor path and the second conductor path and between said first cutting target region and said second cutting target region to form a flowing-out region and thereby generate a broken point in the first conductor path cutting the electrical fuse.

2. The semiconductor device according to claim 1, wherein a current inflow terminal and a current drain terminal for cutting off said first cutting target region and said second cutting target region are provided only on opposite ends of said first conductor, respectively.

3. The semiconductor device according to claim 1, wherein said electrical fuse comprises a first interconnect, a via connected to said first interconnect, and a second interconnect connected to said via, each formed on different layers on said semiconductor substrate, respectively,
   wherein said first interconnect is composed of said first conductor and includes said first cutting target region,
   wherein said via is composed of said second conductor and includes said second cutting target region,
   wherein in a condition before cutting said electrical fuse, said via is electrically connected between said first interconnect and said second interconnect, and
   wherein in the condition of cutting said electrical fuse, a first void region is formed in said first interconnect and a second void region is formed in one of i) between said via and said second interconnect and ii) in said via.

4. The semiconductor device according to claim 3,
   wherein said first interconnect, said second interconnect, and said via are each composed of a copper-containing metallic film containing copper as a major constituent,
   wherein the semiconductor device further comprises a first barrier metal film provided between said second interconnect and said via, so as to be in contact therewith in the condition before cutting said electrical fuse, and
   wherein in the condition of cutting said electrical fuse, said second void region is formed between said first barrier metal film and said second interconnect.

5. The semiconductor device according to claim 3, further comprising:
   an insulating film formed around said first interconnect, said via, and said second interconnect on said semiconductor substrate,
   wherein said first interconnect is formed in an interconnect trench formed in said insulating film, and
   wherein said flowing-out region is formed of said first conductor flowing out of said interconnect trench.

6. The semiconductor device according to claim 5,
   wherein in the condition of cutting said electrical fuse, a crack is generated in said insulating film formed around said first interconnect, and
   wherein said flowing-out region is formed of said first conductor flowing into said crack.

7. The semiconductor device according to claim 3,
   wherein said first interconnect includes a narrow interconnect and a wide interconnect connected to the narrow interconnect and wider than the narrow interconnect, and
   wherein said first cutting target region is formed near a coupling portion connecting said narrow interconnect to said wide interconnect, and said flowing-out region is formed in said wide interconnect.

8. The semiconductor device according to claim 7,
   wherein said wide interconnect includes a folded area in which a plurality of straight lines are arranged in parallel by turning back said wide interconnect, and
   wherein said flowing-out region is formed in said folded area.

9. The semiconductor device according to claim 8,
   wherein said narrow interconnect is connected to said wide interconnect outside of said folded area.

10. The semiconductor device according to claim 8,
    wherein said via is connected to said wide interconnect of said first interconnect in said folded area.

11. The semiconductor device according to claim 7,
    wherein said via is connected to said wide interconnect of said first interconnect.

12. The semiconductor device according to claim 1, wherein said first cutting target region is connected by said second cutting target region to a decision circuit configured to determine whether said electrical fuse is cut.

13. The semiconductor device according to claim 1, wherein the condition of cutting the electrical fuse constitutes a high voltage applied only between a first terminal and a second terminal.

14. The semiconductor device according to claim 13, further comprising:
one or more materials around the first conductor,
wherein, upon the condition of cutting the electrical fuse, the one or more materials are configured to form cracks, and the first conductor is configured to flow into the cracks to form the flowing-out region and generate the broken point in the first conductor path.

15. The semiconductor device according to claim 14, wherein the second cutting target region is also cut upon the first conductor flowing into the flowing-out region between said first cutting target region and said second cutting target region.

16. The semiconductor device according to claim 14, wherein, upon the condition of cutting the electrical fuse, the first conductor is configured to heat and expand to generate the cracks in the one or more materials.

17. The semiconductor device according to claim 1, further comprising:
a current inflow terminal at a first end of said first conductor;
a current drain terminal at an opposite second end of said first conductor; and
a decision terminal at an end of the second conductor branching from said first conductor,
wherein the condition of cutting the electrical fuse comprises a first voltage applied between only the current inflow terminal and the current drain terminal, and
wherein a decision circuit, connected to the decision terminal, determines whether the electrical fuse is cut by measuring a resistance upon a second voltage applied to the decision terminal.

18. A semiconductor device, comprising:
a semiconductor substrate; and
an electrical fuse formed on the semiconductor substrate, wherein the electrical fuse comprises:
a first interconnect formed on a first layer on said semiconductor substrate, said first interconnect comprised of a first conductor including a first cutting target region;
a via formed on a second layer on said semiconductor substrate, said via connected to said first interconnect and comprising a second conductor, the second conductor branched from and connected to said first conductor and including a second cutting target region;
a second interconnect formed on a third layer on said semiconductor substrate connected to said via, said second interconnect including a second cutting target region; and
first barrier metal film provided between said second interconnect and said via,
wherein said first interconnect, said second interconnect, and said via are each composed of a copper-containing metallic film containing copper as a major constituent,
wherein, in a condition before cutting said electrical fuse, said via is electrically connected between said first interconnect and said second interconnect, and said first barrier metal film is in contact with both said second interconnect and said via,
wherein, upon a condition of cutting said electrical fuse, a flowing-out region is formed of said first conductor flowing toward an outside region between said first cutting target region and said second cutting target region,
wherein in the condition of cutting said electrical fuse, a first void region is formed in said first interconnect and a second void region is formed in one of i) between said via and said second interconnect and ii) in said via, and
wherein in the condition of cutting said electrical fuse, said second void region is formed between said first barrier metal film and said second interconnect.

19. A semiconductor device, comprising:
a semiconductor substrate; and
an electrical fuse formed on the semiconductor substrate, wherein the electrical fuse comprises:
a first interconnect formed on a first layer on said semiconductor substrate, said first interconnect comprised of a first conductor including a first cutting target region;
a via formed on a second layer on said semiconductor substrate, said via connected to said first interconnect and comprising a second conductor, the second conductor branched from and connected to said first conductor and including a second cutting target region; and
a second interconnect formed on a third layer on said semiconductor substrate connected to said via, said second interconnect including a second cutting target region,
wherein said first interconnect includes a narrow interconnect and a wide interconnect wider than the narrow interconnect and connected to the narrow interconnect,
wherein said first cutting target region is formed near a coupling portion connecting said narrow interconnect to said wide interconnect,
wherein a flowing-out region is formed in said wide interconnect,
wherein, in a condition before cutting said electrical fuse, said via is electrically connected between a first interconnect and said second interconnect, and said first barrier metal film is in contact with both said second interconnect and said via,
wherein, upon a condition of cutting said electrical fuse, said flowing-out region is formed of said first conductor flowing toward an outside region between said first cutting target region and said second cutting target region, and
wherein in the condition of cutting said electrical fuse, a first void region is formed in said first interconnect and a second void region is formed in one of i) between said via and said second interconnect and ii) in said via.

* * * * *